(12) United States Patent
Park et al.

(10) Patent No.: US 12,300,515 B2
(45) Date of Patent: May 13, 2025

(54) SUBSTRATE TREATING APPARATUS AND SUBSTRATE TREATING METHOD

(71) Applicant: SEMES CO., LTD., Cheonan-si (KR)

(72) Inventors: Miso Park, Daejeon (KR); Yong Hee Lee, Cheonan-si (KR); Dohyeon Yoon, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 834 days.

(21) Appl. No.: 17/370,469

(22) Filed: Jul. 8, 2021

(65) Prior Publication Data

US 2022/0013372 A1 Jan. 13, 2022

(30) Foreign Application Priority Data

Jul. 10, 2020 (KR) .......................... 10-2020-0085276

(51) Int. Cl.
*H01L 21/67* (2006.01)
*B08B 7/00* (2006.01)
(Continued)

(52) U.S. Cl.
CPC ...... *H01L 21/67028* (2013.01); *B08B 7/0021* (2013.01); *B08B 7/0071* (2013.01);
(Continued)

(58) Field of Classification Search
CPC ........ H05B 3/30; H05B 3/283; H05B 1/0233; F27D 5/0037; F27B 17/0025;
(Continued)

(56) References Cited

U.S. PATENT DOCUMENTS 6,461,155 B1 * 10/2002 Settles .............. H01L 21/67109
392/416
2003/0116176 A1 * 6/2003 Rothman .......... H01L 21/67034
134/184
(Continued)

FOREIGN PATENT DOCUMENTS

JP 2005-005566 A 1/2005
KR 10-2010-0081925 A 7/2010
(Continued)

OTHER PUBLICATIONS

Machine Translation of Korean Office Action for Application No. 10-2020-0085276 on Dec. 19, 2022. (Year: 2022).*
(Continued)

*Primary Examiner* — Benjamin L Osterhout
(74) *Attorney, Agent, or Firm* — Harness, Dickey & Pierce, P.L.C.

(57) ABSTRACT

The inventive concept provides an apparatus for treating a substrate by using a supercritical fluid. In an embodiment, the apparatus may include a process chamber that provides a treatment space, and including a chamber heater that increases a temperature of an interior of the treatment space, a substrate support provided in the treatment space and that supports the substrate, and a substrate heating member that heats a lower surface of the substrate while contacting the lower surface of the substrate.

17 Claims, 15 Drawing Sheets

(51) Int. Cl.
    *B08B 7/04*          (2006.01)
    *F27B 17/00*        (2006.01)
    *F27D 5/00*         (2006.01)
    *H05B 1/02*         (2006.01)
    *H05B 3/30*         (2006.01)
    *H01L 21/687*      (2006.01)
    *H05B 3/28*         (2006.01)

(52) U.S. Cl.
    CPC ............ *B08B 7/04* (2013.01); *F27B 17/0025* (2013.01); *F27D 5/0037* (2013.01); *H05B 1/0233* (2013.01); *H05B 3/30* (2013.01); *H01L 21/67103* (2013.01); *H01L 21/6719* (2013.01); *H01L 21/68742* (2013.01); *H05B 3/283* (2013.01)

(58) Field of Classification Search
    CPC ........... H01L 21/6719; H01L 21/67103; H01L 21/67028; H01L 21/68742; B08B 7/0021; B08B 7/0071; B08B 7/04
    See application file for complete search history.

(56) References Cited

U.S. PATENT DOCUMENTS

2006/0185693 A1*   8/2006   Brown ................. B08B 7/0021
                                                      257/E21.255
2006/0185694 A1*   8/2006   Brown ............. H01L 21/02101
                                                        134/94.1
2006/0186088 A1*   8/2006   Jacobson ................ C03C 15/00
                                                      257/E21.251

FOREIGN PATENT DOCUMENTS

KR     10-2018-0037588 A     4/2018
KR     10-2019-0002112 A     1/2019

OTHER PUBLICATIONS

Korean Office Action dated Dec. 19, 2022 issued in corresponding Korean Appln. No. 10-2020-0085276.

\* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2020-0085276 filed on Jul. 10, 2020, in the Korean Intellectual Property Office, the entire contents of which are hereby incorporated by reference.

BACKGROUND

Embodiments of the inventive concept described herein relate to a substrate treating apparatus and a substrate treating method.

As a design rule for an integrated circuit device decreases, a critical dimension of a semiconductor device to about 20 nm or 30 nm or less, and accordingly, a process for forming a deep and narrow pattern having a relatively high aspect ratio of about 5 or more, and following cleaning and drying processes are required. Methods that use a supercritical fluid when a specific treatment process, for example, etching, cleaning, and drying are performed on a substrate having a structure of a high aspect ratio have been suggested.

In a drying method using a supercritical fluid, when an interior of a process chamber satisfies a condition of high temperature and high pressure, by which a single phase of isopropyl alcohol (IPA) and carbon dioxide ($CO_2$) may be achieved, the IPA that forms a liquid film on a substrate (for example, a wafer) gradually reacts, starting from a surface thereof, and is dried.

According to the conventional technology, the temperature of the substrate increases as $CO_2$ of high temperature is injected while heat is not directly applied to the substrate, and then, all the IPA on the substrate may not be replaced and be partially left so that a drying error may occur when the reaction time is insufficient or the amount of supplied $CO_2$ is lack.

Furthermore, according to the conventional technology, after the liquid film is formed on the substrate by using the IPA of a room temperature, the substrate is introduced into the process chamber. Then, when the process chamber is closed to start the process after the substrate introduced into the process chamber is seated on a support that supports the substrate, the substrate may be located on the support as it is or may be seated on a pin of a structure mounted at a lower portion of the process chamber. The substrate is spaced apart from the upper side of the process chamber and an upper surface of the structure mounted at the lower portion of the process chamber to be maintained in a state, in which the substrate does not directly receive heat from a heat source. In order that the mixture fluid of the IPA and $CO_2$ is in a single phase, it has to be a temperature of 80° C. or more and a pressure of 108 bar or more, and it takes much time to increase the temperature of the IPA of a room temperature formed on the substrate with the liquid film because the IPA does not directly receive heat.

SUMMARY

Embodiments of the inventive concept provide a substrate treating apparatus that may efficiently treat a substrate, and a substrate treating method.

Embodiments of the inventive concept provide a substrate treating apparatus that may further improve a leaning phenomenon when a substrate is dried, and a substrate treating method.

Embodiments of the inventive concept provide a substrate treating apparatus that may increase a temperature of a drying preventing liquid more promptly to decrease a period of time, for which a substrate reaches a supercritical phase, and may improve a unit per equipment hour (UPEH) when the substrate is treated by a supercritical fluid, and a substrate treating method.

Embodiments of the inventive concept provide a substrate treating apparatus that may remove a drying preventing liquid more effectively when a substrate having a pattern of a high aspect ratio, and a substrate treating method.

The aspect of the inventive concept is not limited thereto, and other unmentioned aspects of the present invention may be clearly appreciated by those skilled in the art from the following descriptions.

The inventive concept provides an apparatus for treating a substrate by using a supercritical fluid. In an embodiment, the apparatus may include a process chamber that provides a treatment space, and including a chamber heater that increases a temperature of an interior of the treatment space, a substrate support provided in the treatment space and that supports the substrate, and a substrate heating member that heats a lower surface of the substrate while contacting the lower surface of the substrate.

In an embodiment, a liquid film may be formed on the substrate treated by using the supercritical fluid with a drying preventing liquid.

In an embodiment, the substrate heating member may heat the substrate to a temperature, at which the drying preventing liquid shows a Leidenfrost effect in a reaction with a surface of the substrate.

In an embodiment, the substrate heating member may heat the substrate to a transition boiling point of the drying preventing liquid or more.

In an embodiment, the substrate heating member may heat the substrate to 110° C. or more.

In an embodiment, the chamber heater and the heating member may be controlled independently.

In an embodiment, the substrate heating member may have an area corresponding to a whole surface of the substrate.

In an embodiment, the process chamber may be formed through combination of an upper chamber and a lower chamber coupled to the upper chamber according to upward/downward movement relative to the upper chamber and forming a sealed space through coupling with the upper chamber, and the substrate support may be coupled to the upper chamber, and the substrate heating member may be coupled to the lower chamber.

In an embodiment, the apparatus may further include a first supply port connected to a first supply line that supplies a treatment liquid to a portion of the treatment space of the process chamber, which is located at a lower portion of the substrate, the substrate heating member may be disposed between the first supply port and the substrate support, and may interrupt the supercritical fluid from the first supply port from being directly ejected to the substrate.

In an embodiment, a substrate heater may be embedded in an interior of the substrate heating member, and the substrate may be heated with heat generated by the substrate heating member.

In an embodiment, a substrate heater that heats the substrate heating member may be provided in an interior of the lower chamber, and the substrate heating member may receive heat generated by the substrate heater and heat the substrate.

In an embodiment, the lower chamber may be formed of a stainless steel material.

In an embodiment, the lower chamber and the substrate heating member may be connected to each other by a material having a set thermal conductivity or more.

In an embodiment, the substrate heating member may be formed of a stainless steel material.

According to another aspect of the inventive concept, an apparatus for treating a substrate by using a supercritical fluid may include a process chamber that provides a treatment space, and including a chamber heater that increases a temperature of an interior of the treatment space, a substrate support provided in the treatment space and that supports the support, a lift pin that raises and lowers the substrate from the substrate support such that the substrate support contacts the substrate or the substrate support and the substrate are spaced apart from each other, and a substrate heating member that heats the substrate that contacts the substrate support.

In an embodiment, a liquid film may be formed on the substrate treated by using the supercritical fluid with a drying preventing liquid, and the substrate heating member may heat the substrate to a temperature, at which the drying preventing liquid shows a Leidenfrost effect in a reaction with a surface of the substrate.

In an embodiment, the chamber heater and the heating member may be controlled independently.

In an embodiment, the substrate heating member may be formed of a stainless steel material.

The inventive concept provides a method for treating a substrate by using a supercritical fluid. In an embodiment, the method may include carrying the substrate, on which a liquid film is formed with a drying preventing liquid, into an interior of a treatment space, heating the substrate to a temperature, at which the drying preventing liquid shows a Leidenfrost effect in a reaction with a surface of the substrate, and supplying the supercritical fluid to the substrate and drying the supercritical fluid.

In an embodiment, the heating of the substrate may be performed when an interior of the treatment space is at a supercritical pressure or less.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive may be modified in various forms, and the scope of the inventive concept should not be construed to be limited to the following embodiments. The embodiments of the inventive concept are provided to describe the present inventive for an ordinary person skilled in the art more completely. Accordingly, the shapes of the components of the drawings are exaggerated to emphasize clearer description thereof.

Figure 1:
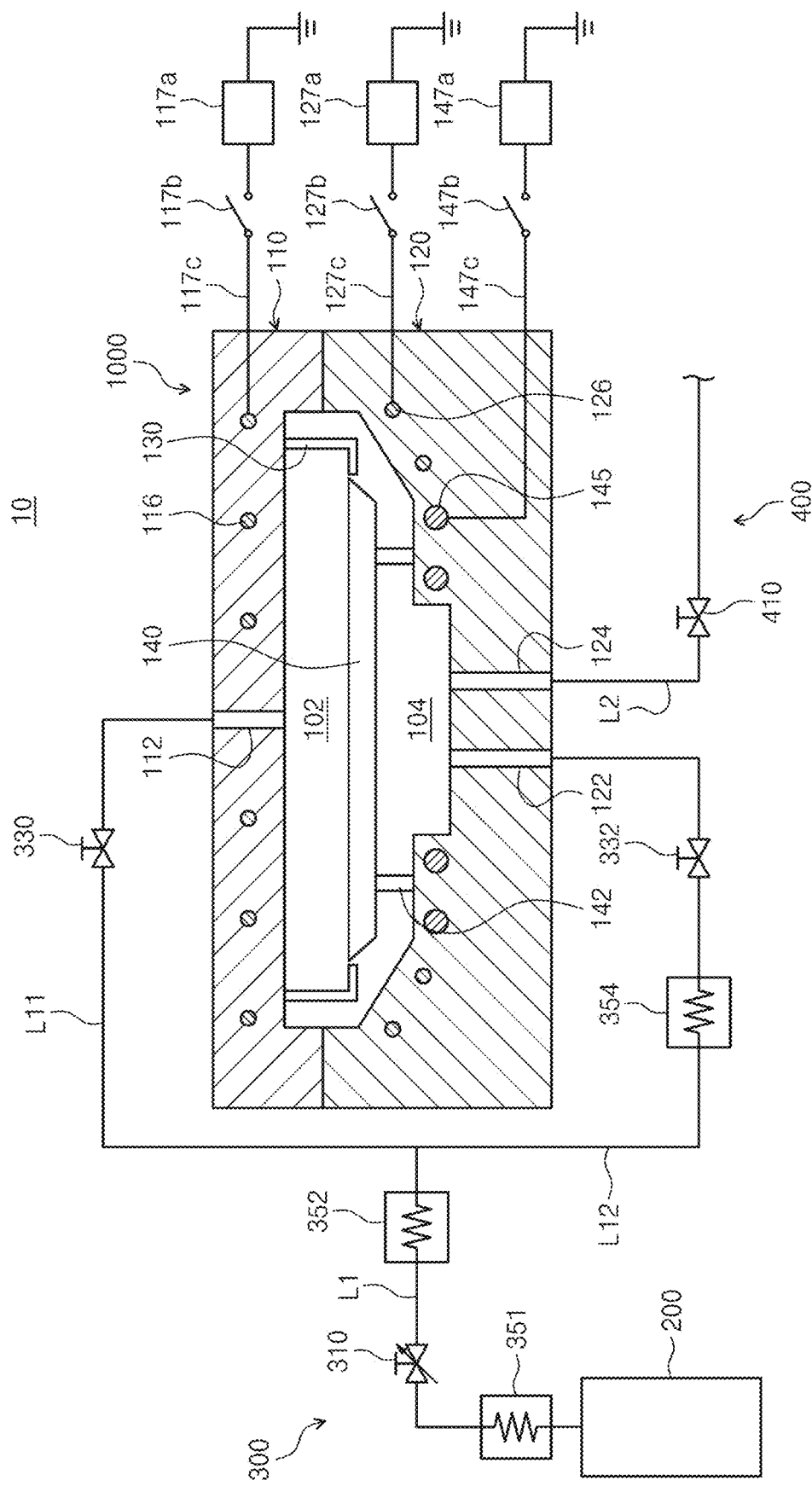
FIG. 1 is a view schematically illustrating a substrate treating apparatus according to a first embodiment of the inventive concept.

FIG. 1 is a view schematically illustrating a substrate treating apparatus according to a first embodiment of the inventive concept.

Referring to FIG. 1, a substrate treating apparatus 10 may include a substrate treating unit 1000 that supports a substrate, such as a wafer, and treats the substrate through a supercritical process using a supercritical process, a supercritical fluid generator 200 that generates the supercritical fluid, a fluid supply unit 300 that supplies the supercritical fluid from the supercritical fluid generator 200 to process chambers 110 and 120, and a fluid exhausting unit 400 that exhausts the supercritical fluid from the process chamber 100.

The supercritical process may include a cleaning process, a drying process, an etching process, and the like, which use the supercritical fluid, and a drying process will be representatively exemplified in a description of the inventive concept in the specification.

The supercritical fluid may be a substance that has a dispersion property, a viscosity, and a surface tension like gas, and has a temperature and a pressure of threshold points or more while having a solubility like liquid. For example, the supercritical fluid may include carbon dioxide ($CO_2$), water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), and acetone ($C_3H_8O$).

In an embodiment, the substrate treating unit 1000 may include process chambers 110 and 120, a substrate support 130, a first supply port 122, a second supply port 112, and an exhaust port 124. The substrate treating unit 1000 may dry the substrate "W", on which a rinsing process has been made, by using a treatment fluid in a supercritical state. In an embodiment, carbon dioxide ($CO_2$) may be used as the treatment fluid.

The process chambers 110 and 120 may provide treatment spaces 102 and 104 for drying the substrate. The treatment spaces 102 and 104 may include a process area 102 and a buffer area 104. The process area 102 may be an area, in which a pattern surface on the substrate is located, and the buffer area 104 may be an area under the substrate.

The process chambers 110 and 120 may include an upper chamber 110 and a lower chamber 120. The upper chamber 110 may include an upper wall and a first side wall. The upper wall of the upper chamber 110 may be provided as an upper wall of the process chamber. The first side wall of the upper chamber 110 may be provided as a portion of a side wall of the process chamber. The lower chamber 120 may include a lower wall and a second side wall. The lower wall of the lower chamber 120 may be provided as a lower wall of the process chamber. The second side wall of the lower chamber 120 may be provided as a portion of the side wall of the process chamber.

As the upper chamber 110 and the lower chamber 120 are relatively moved by a driving mechanism (not illustrated), they may be engaged with each other such that a closing location for closing the process chambers 110 and 120 and an opening location for opening the process chambers 110 and 120 may be switched. For example, at least any one of the upper chamber 110 and the lower chamber 120 may be moved upwards and downwards along an elevation rod to be coupled to each other or separated from each other. At the opening locations of the process chambers 110 and 120, the substrate may be loaded or unloaded. At the closing locations of the process chambers 110 and 120, the supercritical drying process for the substrate may be performed.

The substrate support 130 may be disposed in the process chambers 110 and 120 and may support the substrate "W" when the substrate "W" is loaded into the process chambers 110 and 120. The substrate support 130 may support the substrate when the substrate "W" is loaded into and unloaded from the process chambers 110 and 120 at the opening locations of the process chambers 110 and 120. Furthermore, the substrate support 130 may support the substrate when the substrate is treated in the process chambers 110 and 120.

The substrate support 130 may include a first vertical rod 132 (see FIG. 2) that extends from the upper wall of the upper chamber 110 to a lower side, and a first horizontal rod 134 (see FIG. 2) that extends from one end of the first vertical rod 132 horizontally. Furthermore, the substrate support 130 may include a first support protrusion (not illustrated) that protrudes on the first horizontal rod 132 and supports the substrate while contacting an edge area of the substrate. Two substrate supports 130 are disposed to be spaced apart from each other by a distance corresponding to a diameter of the substrate. Accordingly, the substrate supports 130 may support the edge area of the substrate.

The substrate treating unit 1000 may include a substrate heating member 140 disposed between a lower wall of the lower chamber 120 and the substrate support 130. The substrate heating member 140, as will be described below in detail, directly heats the substrate while directly contacting the lower surface of the substrate supported by the substrate support 130. The substrate heating member 140 has an area corresponding to a whole surface of the substrate. Preferably, the substrate heating member 140 has a circular shape when viewed from the top.

The substrate heating member 140 may be installed to be spaced apart from the lower wall of the lower chamber 120 by a preset distance. The substrate heating member 140 may be fixed onto the lower wall of the lower chamber 120 by a support rod 142. The substrate heating member 140 may include a plate of a specific thickness that occupies a specific space in the buffer area 104. The substrate heating member 140 may interrupt the supercritical fluid from the first supply port 122 from being directly ejected to a rear surface of the substrate "W".

Furthermore, a volume of the buffer area 104 may be reduced due to the substrate heating member 140. The volume of the buffer area 104 may be smaller than a volume of the process area 102. Accordingly, an amount of the treatment fluid that is present in the buffer area 104 under the substrate "W" may be smaller than an amount of the treatment fluid that is present in the process area 102 on the substrate "W". The substrate heating member 140 may decrease process time by providing a structure in the buffer space under the substrate W to maintain process performance while decreasing an amount of the treatment liquid used for the drying process, and thus reducing the buffer space.

Furthermore, a space may be provided between the lower chamber 120 of the substrate heating member 140 and the lower wall to provide a direction of the flow of the fluid in the interior of the high-pressure process chamber.

While the treatment fluid is introduced into the drying process chamber via the pipelines L1, L11, and L12 and the valves 310, 330, and 332 of the fluid supply unit 300 after being stored in the supercritical fluid generator 200 at a high pressure, a cooling phenomenon may occur at the connection portions of the valves 310, 330, and 332 and the pipelines due to a pressure drop and, during the process, the treatment fluid may be liquefied or solidified to be left as particle contaminants or other impurities may cause solidification of the treatment liquid, and thus it is important to maintain the temperature of the treatment fluid at a threshold value or more. Furthermore, because heat cannot be sufficiently transferred to a gaseous or supercritical solvent only simply by maintaining a temperature of the pipeline when pressing speed increases, a pressurizing or pressure-releasing time may be easily controlled by minimizing a phase change and reducing a density change due to the temperature while the supercritical fluid flows from the supercritical fluid generator 200 to the drying process chamber 100 through additional heat exchangers 351, 352, and 354 (or temperature adjusting jackets).

The first supply port 122 may be installed in the lower chamber 120. The first supply port 122 may be installed on the lower wall of the lower chamber 120. The treatment fluid may be supplied to the buffer area 104 located under the substrate "W" through the first supply port 122.

The second supply port 112 may be installed in the upper chamber 110. The second supply port 112 may be installed in a central area of the upper wall of the upper chamber 110. The treatment fluid may be supplied to the process area 102 located on the substrate "W" through the second supply port 112.

The exhaust port 124 may be installed in the lower chamber 120. The exhaust port 124 may be located on the lower wall of the lower chamber 120 to be adjacent to the first supply port 122. The exhaust port 124 is connected to the exhaust line L2. An exhaust valve 410 is installed in the exhaust line L2. The exhaust port 124 may exhaust the fluid used in the supercritical fluid process from the treatment space of the process chamber. A chemical may be resolved in the exhausted treatment fluid. The treatment fluid exhausted from the exhaust port 124 may be drained or may be supplied to a recycling apparatus (not illustrated) and be separated into the supercritical fluid and an organic solvent.

The substrate treating unit 1000 may include a heater provided in at least any one of the upper wall and the side wall of the upper chamber 110 and the lower wall and the side wall of the lower chamber 120. The heater may heat the interior of the process chamber such that the treatment fluid supplied into the interior of the process chamber is maintained at the threshold value or more. For example, the heater may include a first heater 116 provided in the upper chamber 110, and may include a second heater 126 provided in the lower chamber 120.

Furthermore, the substrate treating unit 1000 includes a substrate heater 145 in the lower chamber 120. It is preferable that the substrate heater 145 is provided to be adjacent to the support rod 142 connected to the substrate heating member 140. The substrate heater 145 is heated and delivers the heat to the substrate heating member 140 through the support rod 142. The substrate heating member 140 directly heats the lower surface of the substrate while contacting the lower surface of the substrate that is carried in. A liquid film is formed on a pattern surface of the substrate that is carried into the substrate treating unit 1000 and treated, which corresponds to the upper surface of the substrate, with the drying preventing liquid, and the substrate heating member 140 heats the substrate to a temperature, at which the drying preventing liquid shows a Leidenfrost effect in a reaction with a surface of the substrate.

The first heater 116, the second heater 126, and the substrate heater 145 may be controlled independently. In an embodiment, the first heater 116 may be connected to a first power source 117a by a first power line 117c. A first switch 117b that may control an operation of the first heater 116 may be installed in the first power line 117c. In an embodiment, the second heater 136 may be connected to a second power source 127a by a second power line 127c. A second switch 127b that may control an operation of the second heater 126 may be installed in the second power line 127c. In an embodiment, the substrate heater 145 may be connected to a third power source 147a by a third power line 147c. A third switch 147b that may control an operation of the substrate heater 145 may be installed in the third power line 147c. Although not illustrated, a temperature control device for independently controlling the temperatures of the first heater 116, the second heater 126, and the substrate heater 145 may be provided.

Figure 2:
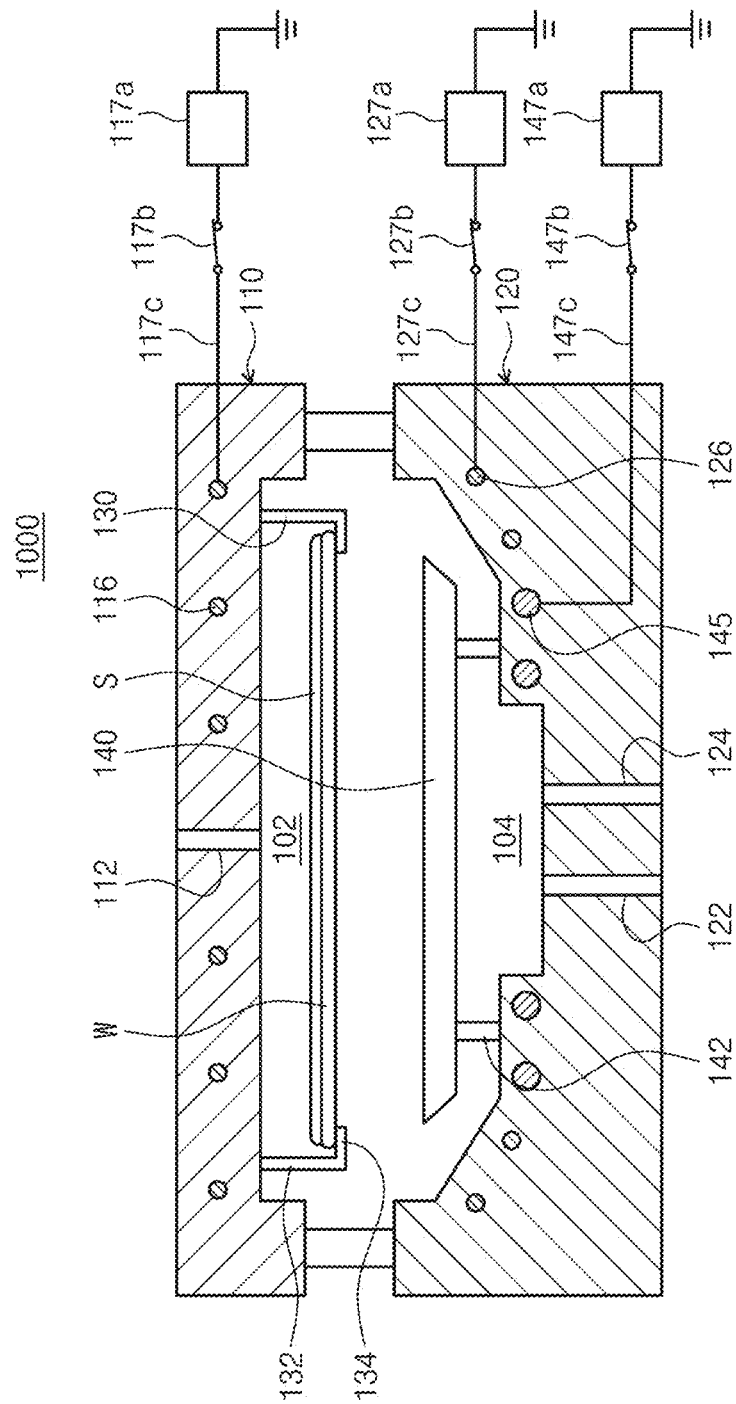
FIGS. 2 and 3 sequentially illustrate states, in which the substrate treating apparatus according to the first embodiment of the inventive concept is controlled according to a sequence, in which processes are performed by using the substrate treating apparatus.
Figure 3:
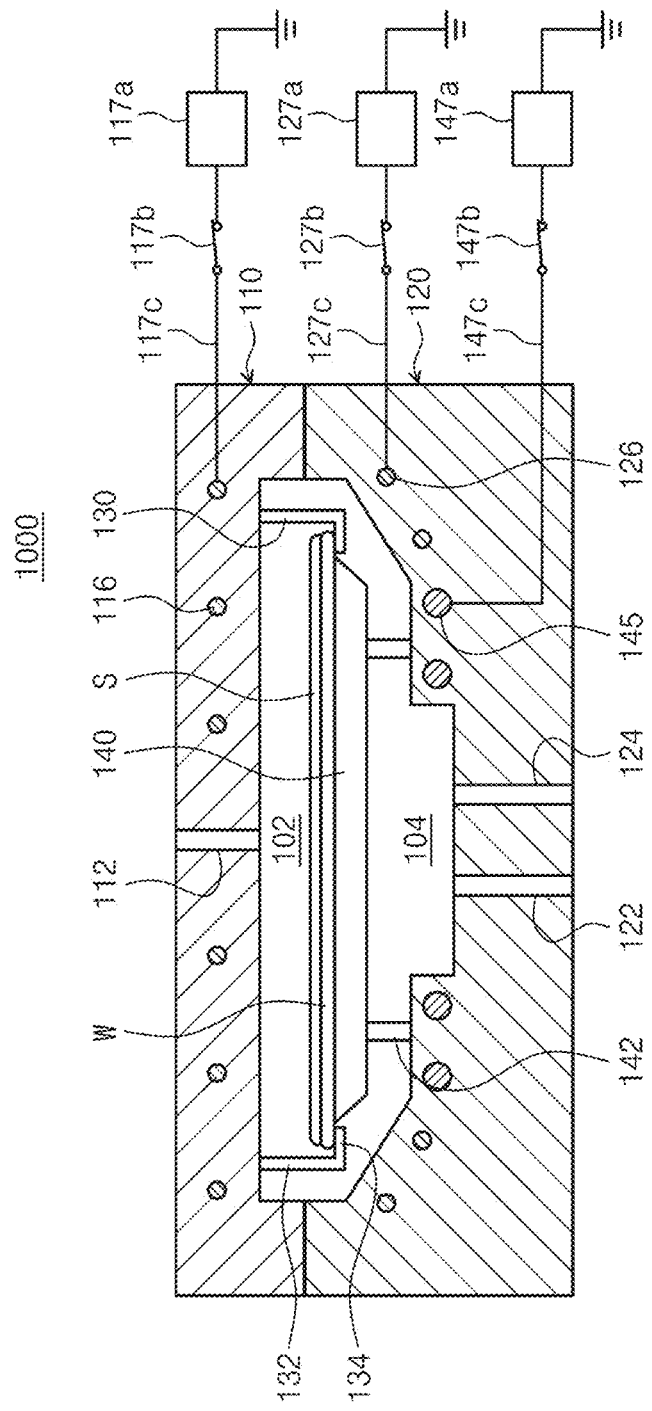

FIGS. 2 and 3 sequentially illustrate states, in which the substrate treating apparatus according to the first embodiment of the inventive concept is controlled according to a sequence, in which processes are performed by using the substrate treating apparatus. Sequentially referring to FIGS. 2 and 3, a method for performing a process by using the substrate treating apparatus according to the first embodiment will be described.

Referring to FIG. 2, the process chambers 110 and 120 are opened as the upper chamber 110 and the lower chamber 120 are spaced apart from each other, and a transfer robot (not illustrated) carries the substrate "W", on which the liquid film is formed on the pattern surface corresponding to the upper surface of the substrate with the organic solvent "S", into the interiors of the opened process chambers 110 and 120. In an embodiment, the organic solvent "S" may be IPA. The substrate "W" carried in is supported by the substrate support 130. Then, the first heater 116, the second heater 126, and the substrate heater 145 may be switched on to be heated. The substrate heater 145 heats the heating member 140 such that the drying preventing liquid heats the substrate "W" to a temperature, at which the drying preventing liquid instantaneously shows a Leidenfrost effect in a reaction with a surface of the substrate, that is, a transition boiling point of the drying preventing liquid or more, when the substrate heater 145 contacts the substrate "W" carried in. In an embodiment, when the organic solvent "S" is the IPA, the substrate heating member 140 heats the substrate "W" to 110° C. or more. More preferably, the substrate heating member 140 heats the substrate "W" to 120° C. or more. In an embodiment, the substrate heating member 140 heats the substrate "W" such that the temperature of the substrate "W" does not exceed 300° C., but the inventive concept is not limited thereto.

Referring to FIG. 3, when the substrate "W" is carried in, the process chambers 110 and 120 are closed while the upper chamber 110 and the lower chamber 120 are coupled to each other. As the process chambers 110 and 120 are closed, the heating member 140 instantaneously heats the substrate "W" while the heating member 140 and the substrate "W" contact each other.

Figure 4:
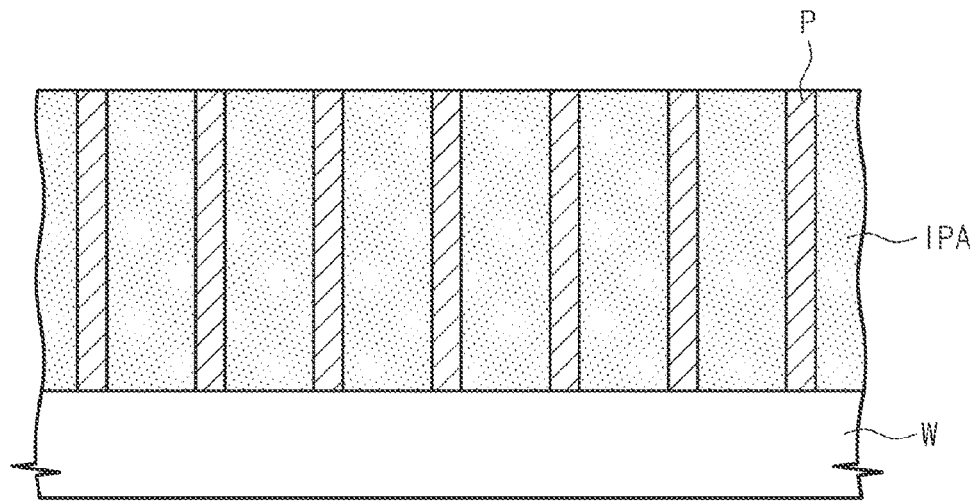
FIGS. 4 and 5 illustrate cross-sections of the substrate treated according to an embodiment of the inventive concept, and illustrate a process of treating a substrate according to a sequence.
Figure 5:
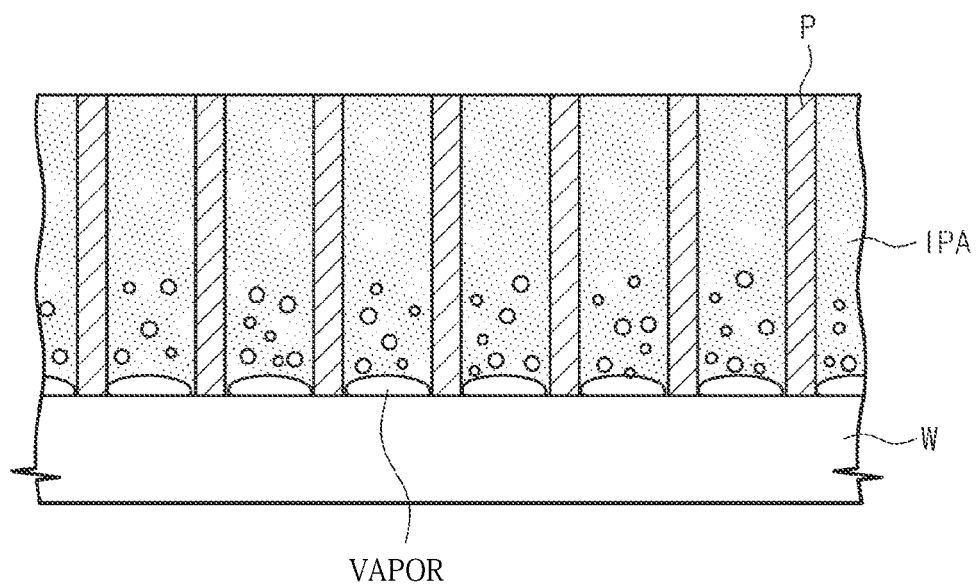

FIGS. 4 and 5 illustrate cross-sections of the substrate treated according to an embodiment of the inventive concept, and illustrate a process of treating a substrate according to a sequence. Sequentially referring to FIGS. 4 and 5, changes in the states of the substrate "W" and the organic solvent "S" will be described.

Referring to FIG. 4, as in the state of FIG. 2, a state before the substrate "W" and the substrate heating member 140 contact each other. FIG. 5 illustrates a state, in which the substrate "W" and the substrate heating member 140 contact each other as in the state of FIG. 3.

As the substrate "W" and the substrate heating member 140 contact each other as in the state of FIG. 3, the IPA provided as the organic solvent "S" is instantaneously evaporated when the substrate "W" is instantaneously heated, and thus the Leidenfrost effect is shown. Then, vapor is formed between the substrate "W" and the IPA. The vapor corresponds to an air layer and separates the substrate "W" and the IPA, and the separated IPA is removed together with the supplied supercritical fluid.

According to the embodiment of the inventive concept, because the temperature of the IPA that resides on the substrate "W" may be increased in a short time, a period of time, for which a supercritical single phase of $CO_2$ and the IPA is reached, may be shortened, and thus an UPEH may be increased. Furthermore, because the substrate "W" and the IPA may be separated, a leaning phenomenon of the pattern "P" may be improved, and accordingly, a substrate, in which a pattern "P" having a higher aspect ratio is formed, may be dried. In other words, because a thin vapor film (a gaseous film) is generated between the IPA liquid and the substrate "W" due to the Leidenfrost effect, the IPA liquid is removed in a state, in which the substrate "W" that is solid and the IPA liquid that is liquid do not contact each other, so that it is advantageous to prevent leaning of the pattern "P".

Furthermore, as in the embodiment of the inventive concept, evaporation does not occur while the substrate "W", on which the liquid film is formed with the IPA of a room temperature, is moved to the process chambers 110 and 120 for supercritical treatment in the liquid treating chamber when the substrate "W" is introduced into the process chambers 110 and 120 to increase the temperature of the IPA liquid film through the substrate heating member 140, and the process chambers 110 and 120 are converted into a high-pressure state in several seconds after the substrate "W" is introduced into the process chambers 110 and 120 and thermal energy is transferred to the IPA in a condition, in which the IPA liquid cannot be evaporated, so that the IPA may reach the supercritical phase promptly, whereby it is effective to decrease the UPEH.

Figure 6:
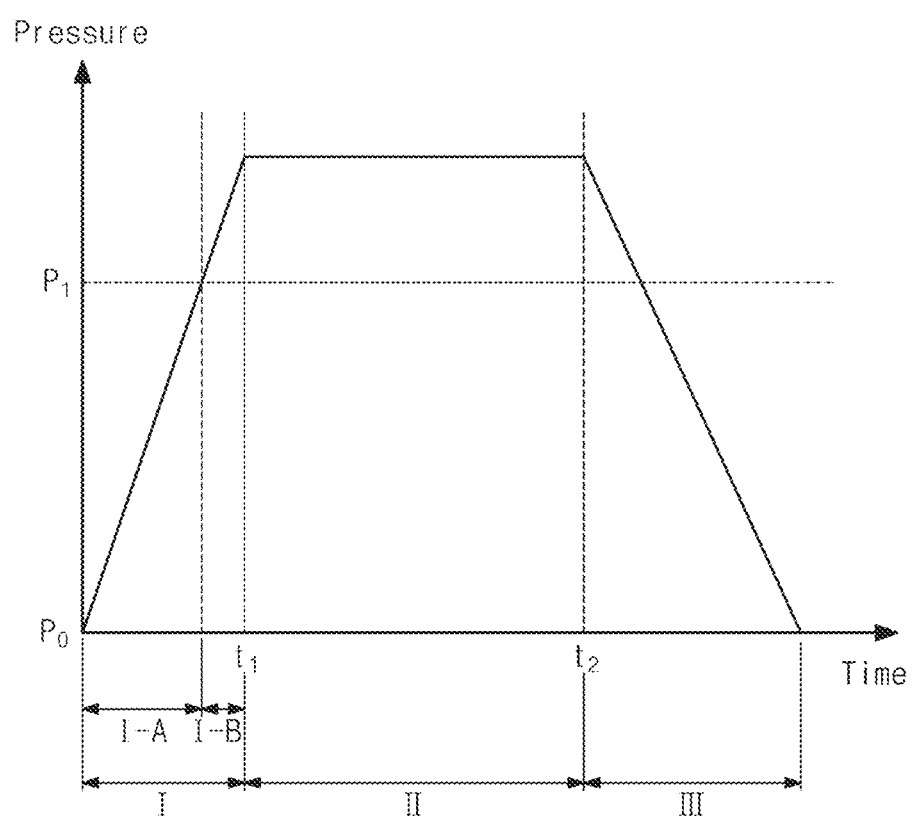
FIG. 6 is a graph illustrating a change in a pressure of a treatment space as a process is performed through a substrate treating apparatus.

FIG. 6 is a graph illustrating a change in a pressure of a treatment space as a process is performed through a substrate treating apparatus. Referring to FIG. 6, a pressure raising operation "I" of gradually increasing the pressure of the interior of the treatment spaces 102 and 104 of the process chambers 110 and 120 from a basic pressure P0 (for example, a normal pressure) to a process pressure P1 by supplying the supercritical fluid to the treatment spaces 102 and 104 after the process chambers 110 and 120 are closed. The process pressure P1 is a pressure that is higher than a supercritical pressure Pcr of the supplied treatment fluid (for example, carbon dioxide). When an internal pressure of the process chambers 110 and 120 reaches the process pressure P1, a replacement operation of removing the mixed organic solvent "S" of the liquid phase, that is, the driving operation II is performed, and thereafter, an exhaustion operation III of reducing the pressure in the interior of the treatment space to the normal pressure again is performed. It is effective to perform the operation of causing the Leidenfrost effect by instantaneously heating the substrate "W" while the substrate "W" contacts the substrate heating member 140 in a section I-A before the treatment fluid reaches the supercritical pressure Pcr during the pressure raising operation "I".

Figure 7:
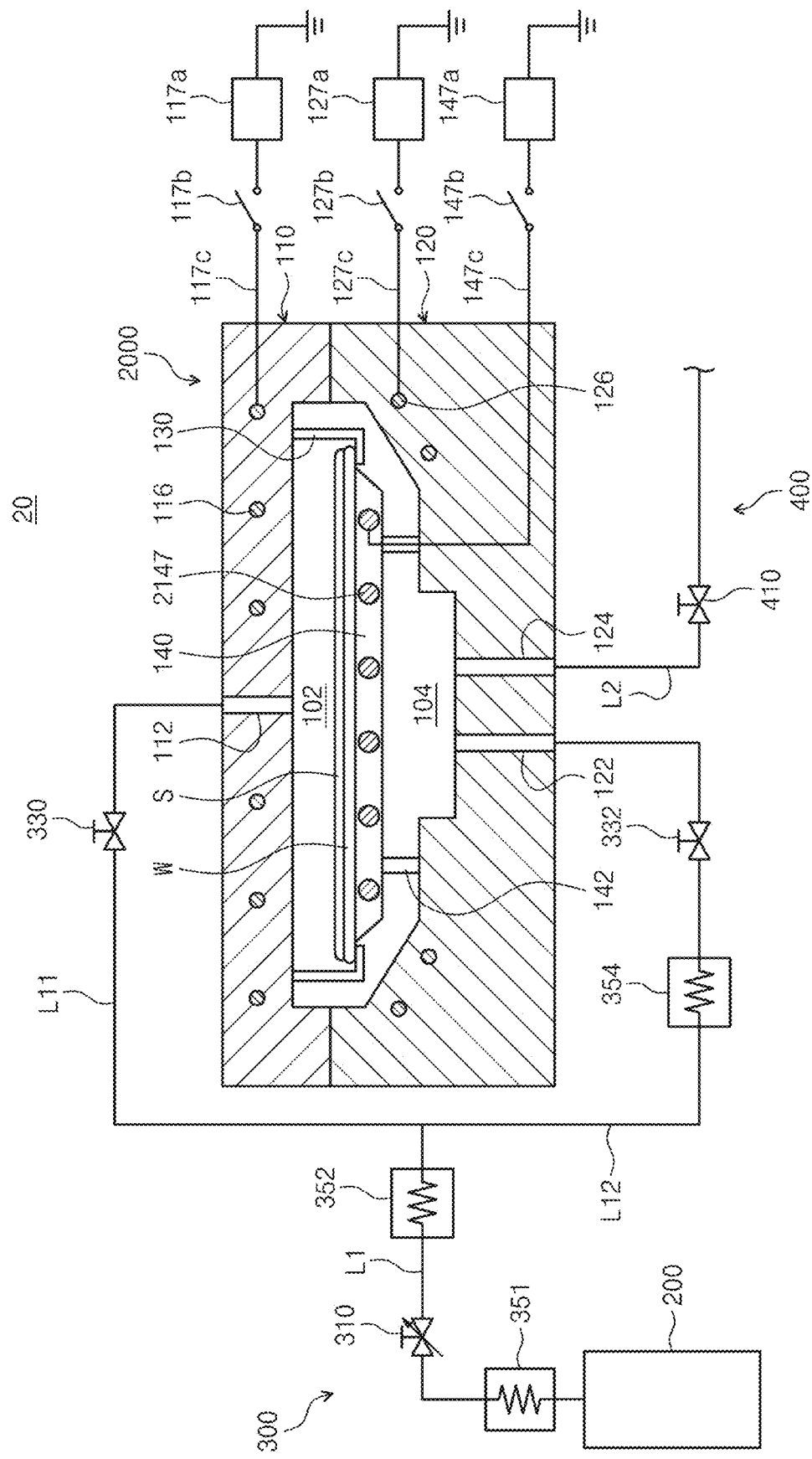
FIG. 7 is a view schematically illustrating a substrate treating apparatus according to a second embodiment of the inventive concept.

FIG. 7 is a view schematically illustrating a substrate treating apparatus 20 according to a second embodiment of the inventive concept. Parts of the substrate treating apparatus 20 and the substrate treating unit 2000 according to the second embodiment, which are different from those of the substrate treating apparatus 10 and the substrate treating unit 1000 according to the first embodiment will be described, and parts of the substrate treating apparatus 20 and the substrate treating unit 2000 according to the second embodiment, which are the same as or similar to those of the substrate treating apparatus 10 and the substrate treating unit 1000 according to the first embodiment, will be replaced by the description of the substrate treating apparatus 10 and the substrate treating unit 1000 according to the first embodiment.

Referring to FIG. 7, a substrate heater 2147 is embedded in an interior of the substrate heating member 140. The embedded substrate heater 2147 may increase an effect of heating the substrate "W" by directly heating the substrate heating member 140. Then, the third power line 147c may be connected to the substrate heater 2147 in the interior of the substrate heating member 140 through the support rod 142. An operation of treating the substrate "W" by using the substrate treating apparatus 2000 according to the second embodiment is the same as or similar to the operation of treating the substrate "W" by using the substrate treating apparatus 10, to which the substrate treating unit 1000 according to the first embodiment is applied, and thus a description thereof will be omitted.

FIGS. 8 to 13 schematically sequentially illustrate a substrate treating apparatus according to a third embodiment of the inventive concept and operations of treating a substrate by using the substrate treating apparatus. Parts of the substrate treating apparatus 30 and the substrate treating unit 3000 according to the third embodiment, which are different from those of the substrate treating apparatus 10 and the substrate treating unit 1000 according to the first embodiment will be described, and parts of the substrate treating apparatus 30 and the substrate treating unit 3000 according to the third embodiment, which are the same as or similar to those of the substrate treating apparatus 10 and the substrate treating unit 1000 according to the first embodiment, will be replaced by the description of the substrate treating apparatus 10 and the substrate treating unit 1000 according to the first embodiment.

The substrate treating apparatus 30 includes the substrate treating unit 3000. The substrate treating unit 3000 includes an upper chamber 3100 and a lower chamber 3120. The upper chamber 3110 may include an upper wall and a first side wall. The upper wall of the upper chamber 3110 may be provided as an upper wall of the process chamber. The first side wall of the upper chamber 3110 may be provided as a portion of a side wall of the process chamber. The lower chamber 3120 may include a lower wall. The lower wall of the lower chamber 120 is a substrate support 3130, and also functions as a substrate heating member 3140.

As the upper chamber 3110 and the lower chamber 3120 are relatively moved by a driving mechanism 3160, they may be engaged with each other such that a closing location for closing the process chambers 3110 and 3120 and an opening location for opening the process chambers 3110 and 3120 may be switched. For example, at least any one of the upper chamber 3110 and the lower chamber 3120 may be moved upwards and downwards along an elevation rod 3162 to be coupled to each other or separated from each other. At the opening locations of the process chambers 3110 and 3120, the substrate may be loaded or unloaded. At the closing locations of the process chambers 3110 and 3120, the supercritical drying process for the substrate may be performed.

The substrate support 3130 may support the substrate "W" when the substrate "W" is loaded into the process chambers 110 and 120. The substrate support 3130 may support the substrate when the substrate "W" is loaded into and unloaded from the process chambers 3110 and 3120 at the opening locations of the process chambers 3110 and 3120. Furthermore, the substrate support 3130 may support the substrate when the substrate is treated in the process chambers 3110 and 3120.

The substrate support 3130 may be provided in a form, in which the lower wall of the lower chamber 3120 protrudes. However, this is simply an embodiment, and the substrate support 3130 may be provided as a separate configuration from the lower chamber 3120 to be coupled to the lower chamber 3120.

The substrate support 3130 includes a lift pin 3135. The lift pin 3135 is provided to be elevated. The lift pin 3135 elevates the substrate "W" from the substrate support 3130 through elevation of the lift pin 3135 to cause the substrate support 3130 and the substrate "W" to contact each other or to be spaced apart from each other. When the transfer robot (not illustrated) enters the process chambers 3110 and 3120 to carry the substrate "W" into the process chambers 3110 and 3120, the lift pin 3135 is raised. Furthermore, when the substrate "W" is loaded on the substrate support 3130, the lift pin 3135 is lowered.

The substrate support 3130 may function as the substrate heating member 3140. A substrate heater 3145 is embedded in the substrate support 3130 such that the substrate support 3130 functions as the substrate heating member 3140. The substrate heating member 3140 is lowered by the lift pin 3135 to directly heat the substrate "W" that contacts the substrate support 3130. The substrate heating member 3140 has an area corresponding to a whole surface of the substrate "W". Preferably, the substrate heating member 3140 has a circular shape when viewed from the top. In the third embodiment, the substrate support 3130 that is the substrate heating member 3140 may have a diameter that is larger than the diameter of the substrate "W". A liquid film is formed on a pattern surface of the substrate "W" that is carried into the substrate treating unit 3000 and treated, which corresponds to the upper surface of the substrate "W", with the drying preventing liquid, and the substrate heating member 3140 heats the substrate "W" to a temperature, at which the drying preventing liquid shows a Leidenfrost effect in a reaction with a surface of the substrate "W".

The first supply port 3122 may be installed in the lower chamber 3120. The first supply port 3122 may be installed on the lower wall of the lower chamber 3120. In more detail, the first supply port 3122 may be provided to avoid a location of the lower chamber 3120, at which the substrate support 3130 is provided. The treatment fluid may be supplied to the process area 3102 located under the substrate "W" through the first supply port 3122.

The second supply port 3112 may be installed in the upper chamber 3110. The second supply port 3112 may be installed in a central area of the upper wall of the upper chamber 3110. The treatment fluid may be supplied to the process area 3102 located on the substrate "W" through the second supply port 3112.

The exhaust port 3124 may be installed in the lower chamber 3120. The exhaust port 3124 may be installed on the lower wall of the lower chamber 3120. In more detail, the exhaust port 3124 may be provided to avoid the location of the lower chamber 3120, at which the substrate support 3130 is provided. The first support port 3122 and the exhaust port 3124 may be provided at opposite directions with respect to the substrate support 3130. The exhaust port 3124 may exhaust the fluid used in the supercritical fluid process from the treatment space of the process chamber. A chemical may be resolved in the exhausted treatment fluid. The treatment fluid exhausted from the exhaust port 3124 may be drained or may be supplied to a recycling apparatus (not illustrated) and be separated into the supercritical fluid and an organic solvent.

The substrate treating unit 3000 may include a heater provided in at least any one of the upper wall and the side wall of the upper chamber 3110 and the lower wall of the lower chamber 3120. The heater may heat the interior of the process chamber such that the treatment fluid supplied into the interior of the process chamber is maintained at the threshold value or more. For example, the heater may include a first heater 3116 provided in the upper chamber 3110, and may include a second heater 3126 provided in the lower chamber 3120.

Figure 8:
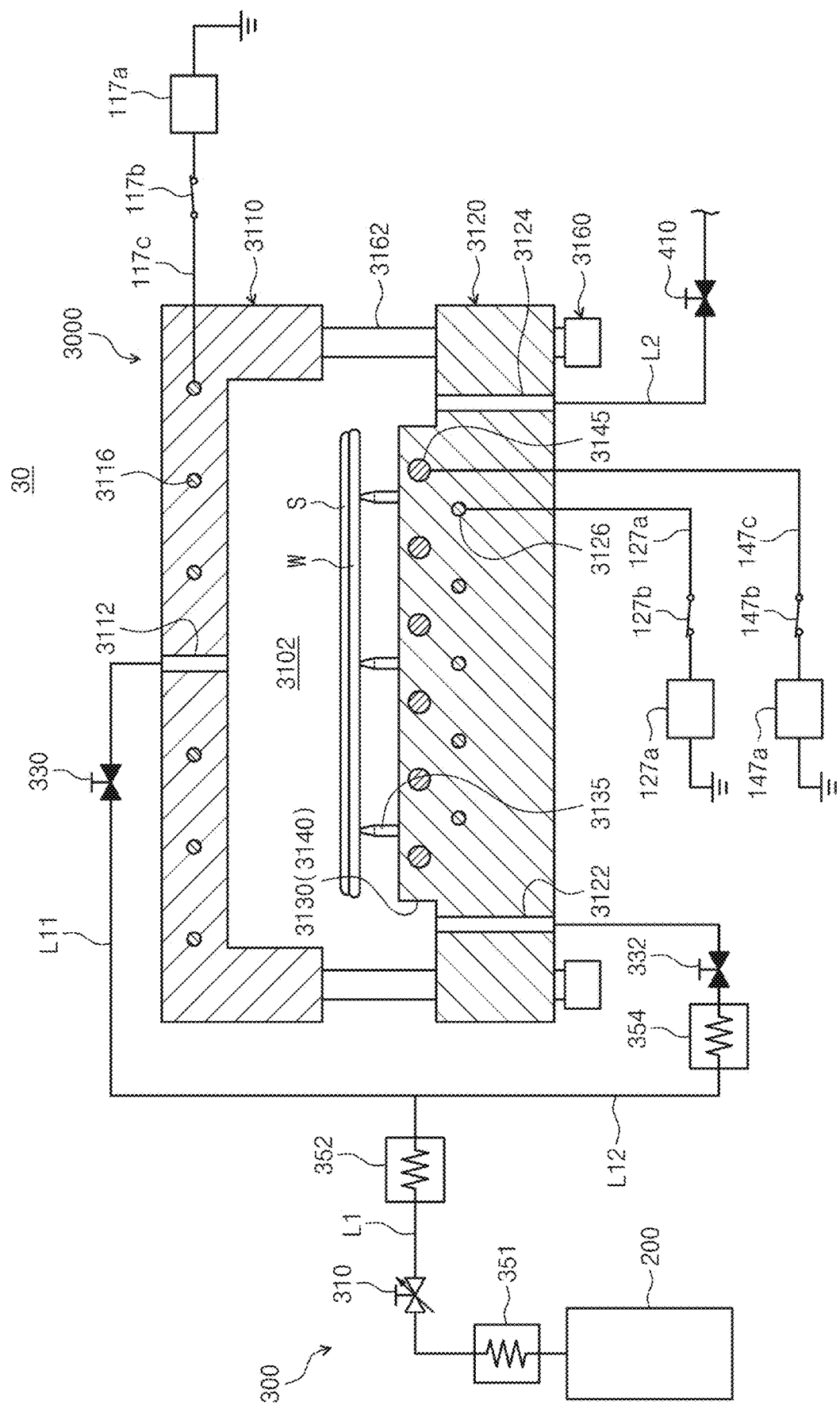
FIGS. 8 to 13 schematically sequentially illustrate a substrate treating apparatus according to a third embodiment of the inventive concept and operations of treating a substrate by using the substrate treating apparatus.

Referring to FIG. 8, the transfer robot (not illustrated) enters the chambers 3110 and 3120 in a state, in which the lift pin 3135 is raised, to carry the substrate "W", on which the liquid film is formed with the organic solvent "S". FIG. 8 illustrates the state, in which the substrate "W" is carried in.

Figure 9:
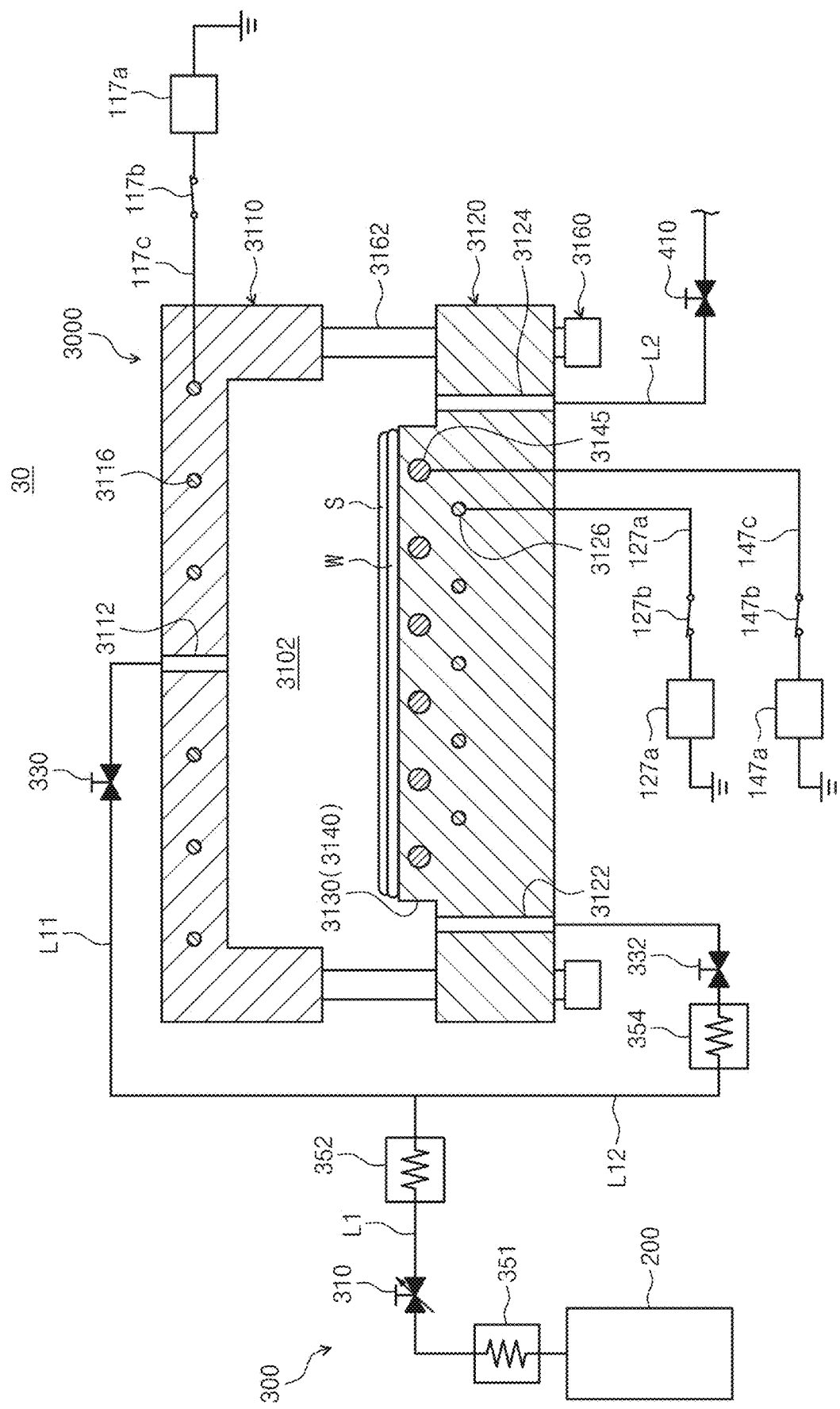
Figure 10:
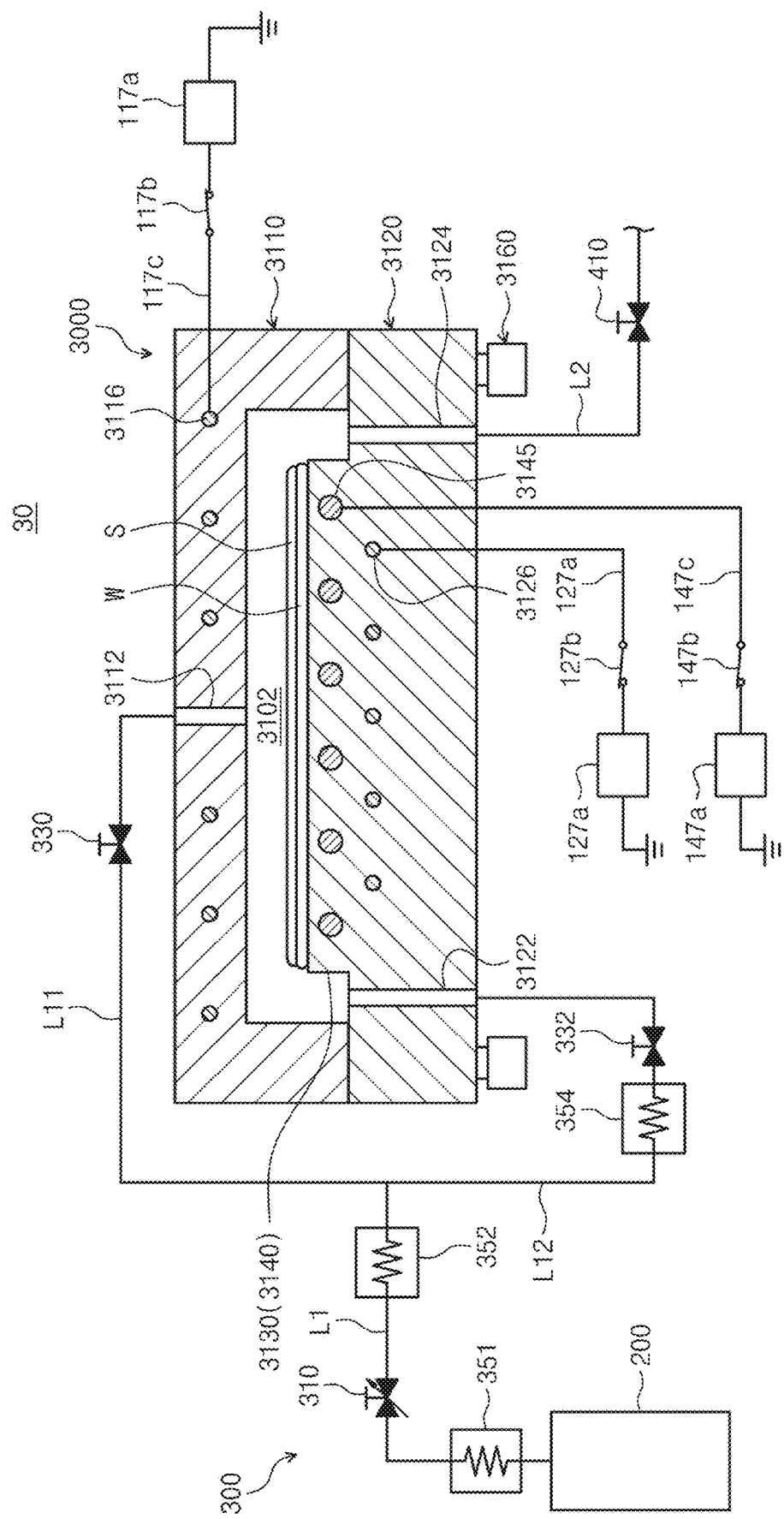

Referring to FIG. 9, the lift pin 3135 is lowered such that the substrate "W" and the substrate heating member 3140 contact each other. Referring to FIG. 10, the process chambers 3110 and 3120 also is at the closing location. The operation illustrated in FIG. 9 and the operation illustrated in FIG. 10 may be changed. As the substrate "W" and the substrate heating member 3140 contact each other, the IPA provided as the organic solvent "S" is instantaneously evaporated when the substrate "W" is instantaneously heated, and thus the Leidenfrost effect is shown.

Figure 11:
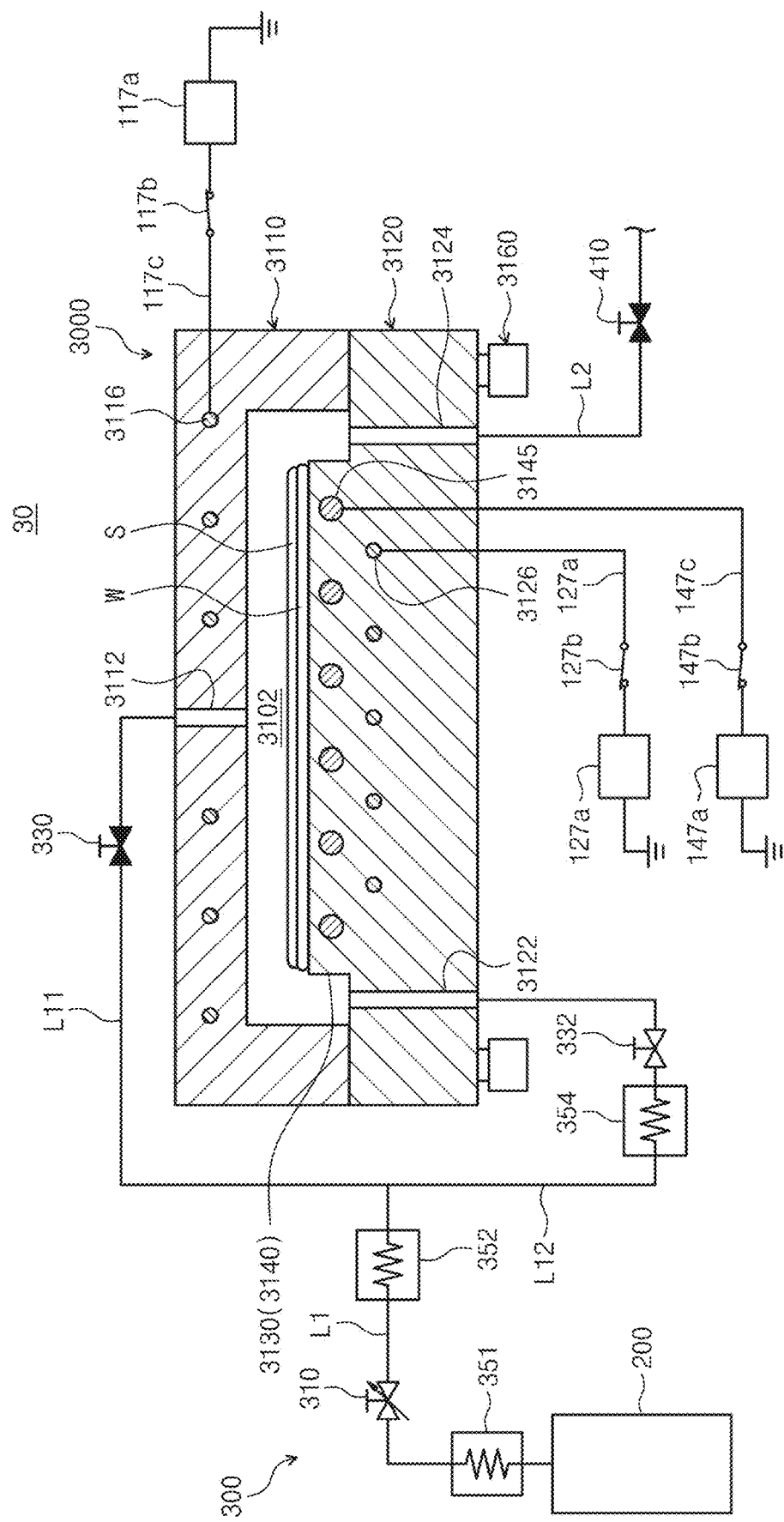
Figure 12:
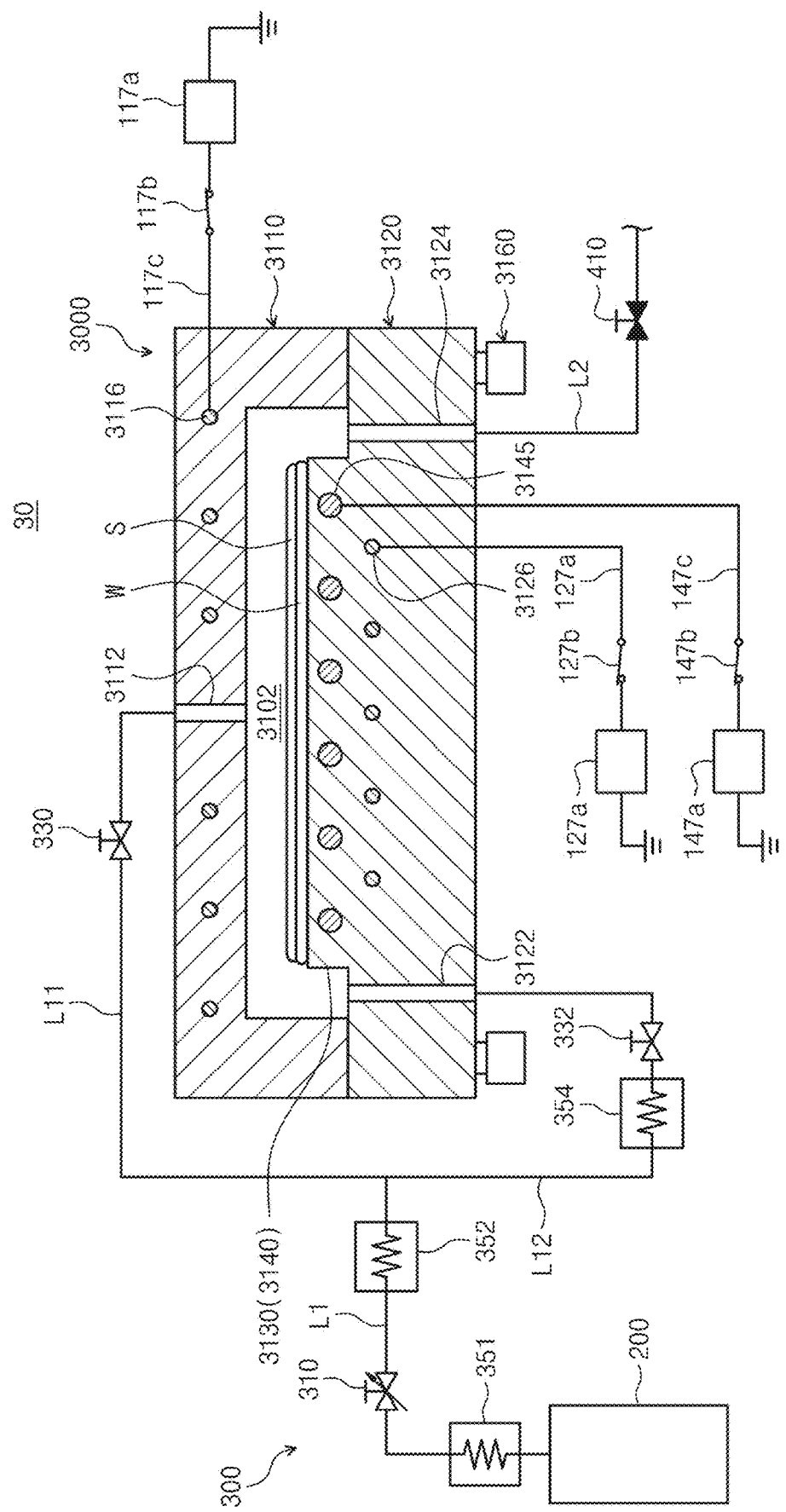
Figure 13:
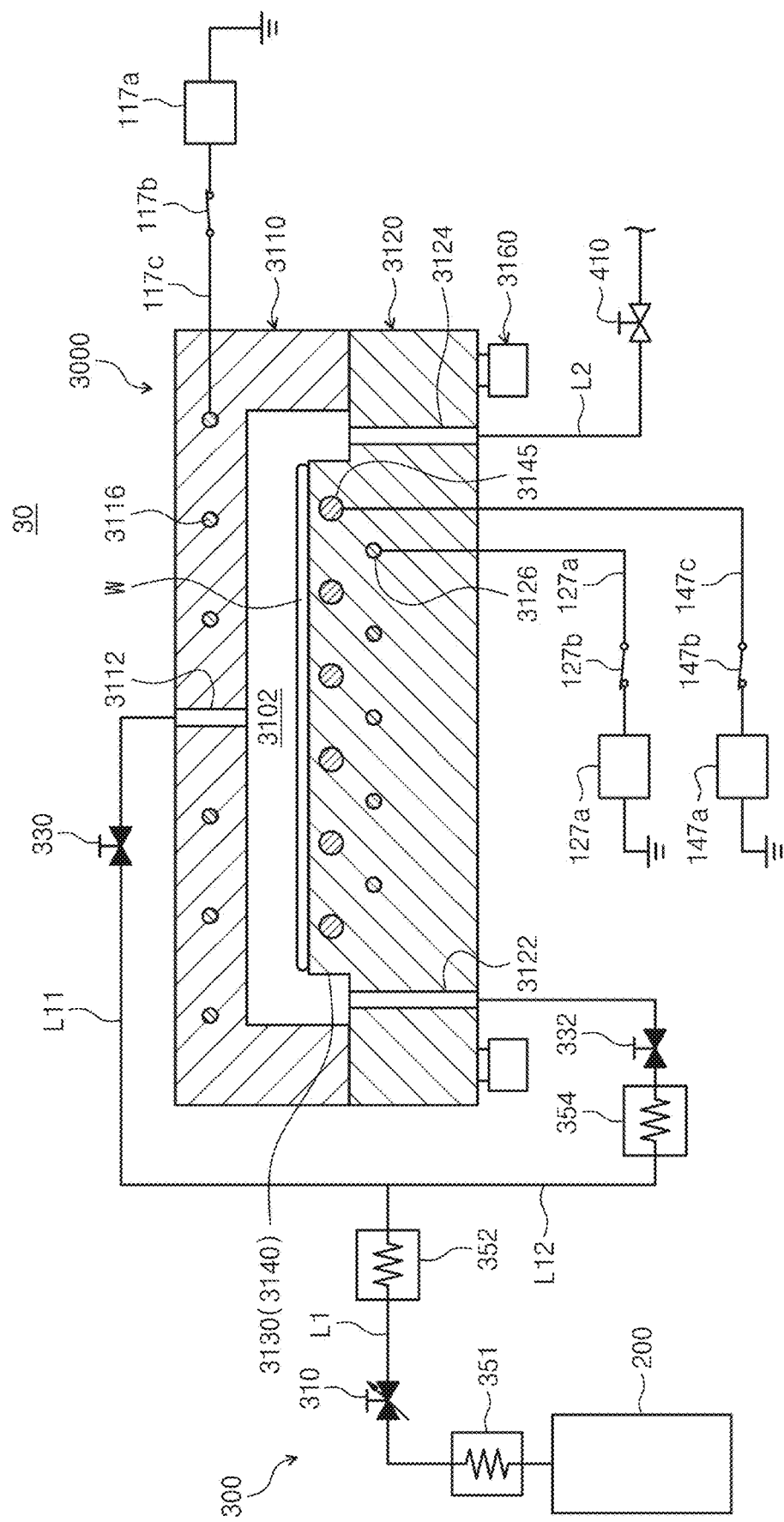

Referring to FIG. 11, the supercritical fluid is supplied from the first supply port 3122 to the process area 3102 by opening the valve 332. When the process area 3102 is at a specific pressure, as in FIG. 12, the supercritical fluid is supplied through the second supply port 3112 by opening the valve 330 to treat the substrate "W".

Figure 14:
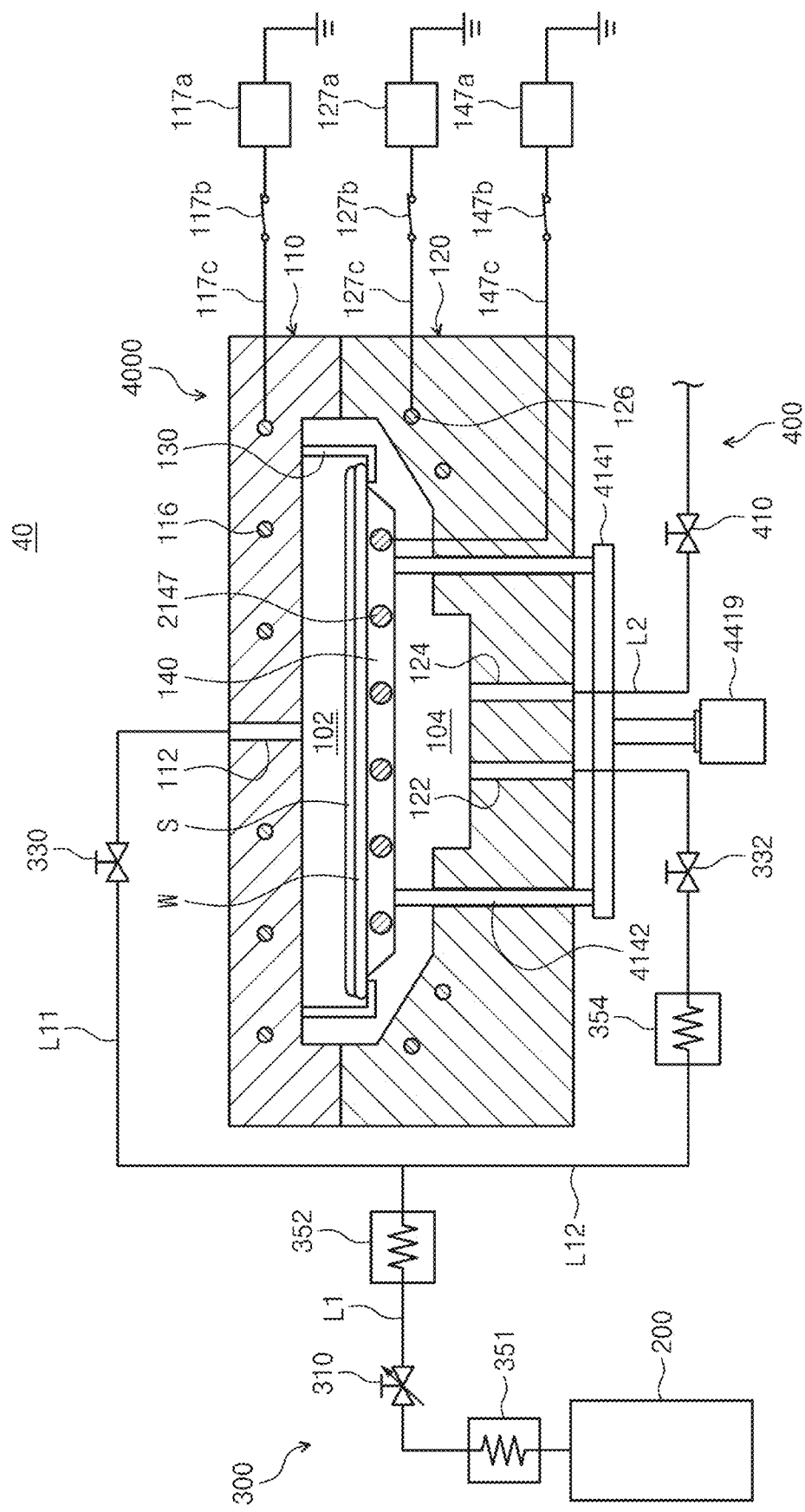
FIG. 14 is a view schematically illustrating a substrate treating apparatus according to a fourth embodiment of the inventive concept.

When the substrate "W" is completely treated, as in FIG. 14, an internal atmosphere of the process area 3102 is exhausted by opening the exhaust valve 410 of the exhaust line L2.

FIG. 14 is a view schematically illustrating a substrate treating apparatus according to a fourth embodiment of the inventive concept. Parts of the substrate treating apparatus 40 and the substrate treating unit 4000 according to the fourth embodiment, which are different from those of the substrate treating apparatus 10 and the substrate treating unit 1000 according to the first embodiment will be described, and parts of the substrate treating apparatus 40 and the substrate treating unit 4000 according to the fourth embodiment, which are the same as or similar to those of the substrate treating apparatus 10 and the substrate treating unit 1000 according to the first embodiment will be replaced by the description of the substrate treating apparatus 10 and the substrate treating unit 1000 according to the first embodiment. The substrate heating member 140 of the substrate treating unit 4000 is coupled by an elevation rod 4142. The elevation rod 4142 is coupled to an elevation plate 4141, and the elevation plate 4141 is coupled to a driver 4419 to be elevated. The substrate heater 2147 of the substrate heating member 140 heats the supported substrate "W" by heating the substrate heating member 140.

Figure 15:
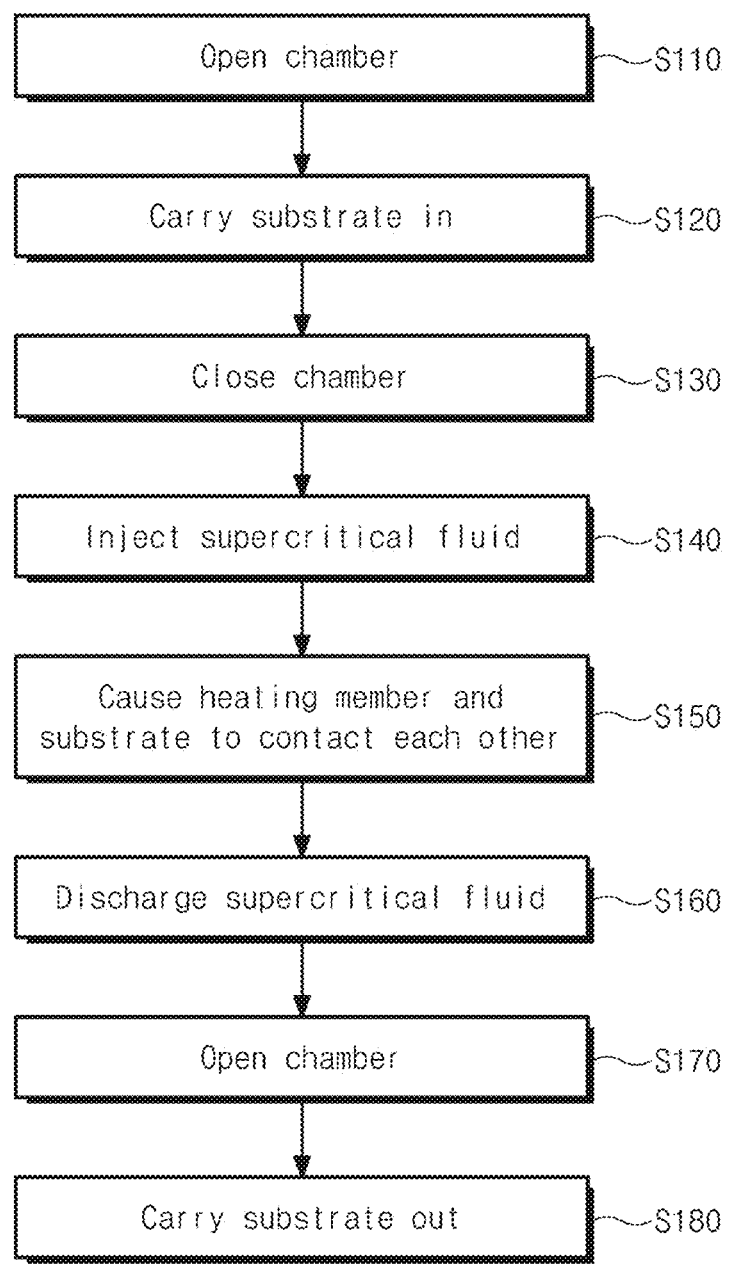
FIG. 15 is a flowchart illustrating a method of treating a substrate according to an embodiment by using the substrate treating apparatus according to the fourth embodiment of the inventive concept.

FIG. 15 is a flowchart illustrating a method of treating a substrate according to an embodiment by using the substrate treating apparatus according to the fourth embodiment of the inventive concept. Referring to FIG. 15, the process chambers 110 and 120 are opened (S110), and the substrate "W" is carried in (S120). After the substrate "W" is carried in, the process chambers 110 and 120 are closed (S130). Furthermore, the supercritical fluid starts to be injected into the process chambers 110 and 120 through the first support port 122 or the second support port 112 (S140). The Leidenfrost effect is caused for the organic solvent "W" by causing the substrate heating member 140 and the substrate "W" to contact each other before the internal pressure of the process chambers 110 and 120 reaches the supercritical pressure of the treatment fluid (S150). Furthermore, when the internal pressure of the process chambers 110 and 120 reaches the process pressure through the consistent injection of the supercritical fluid, the process of treating the substrate by using the supercritical fluid is performed. After the process, the supercritical fluid is exhausted (S160). When the supercritical fluid is exhausted and the internal pressure of the process chambers 110 and 120 becomes a normal pressure, the process chambers 110 and 120 are opened (S170) and the substrate "W" is carried out (S180).

Figure 16:
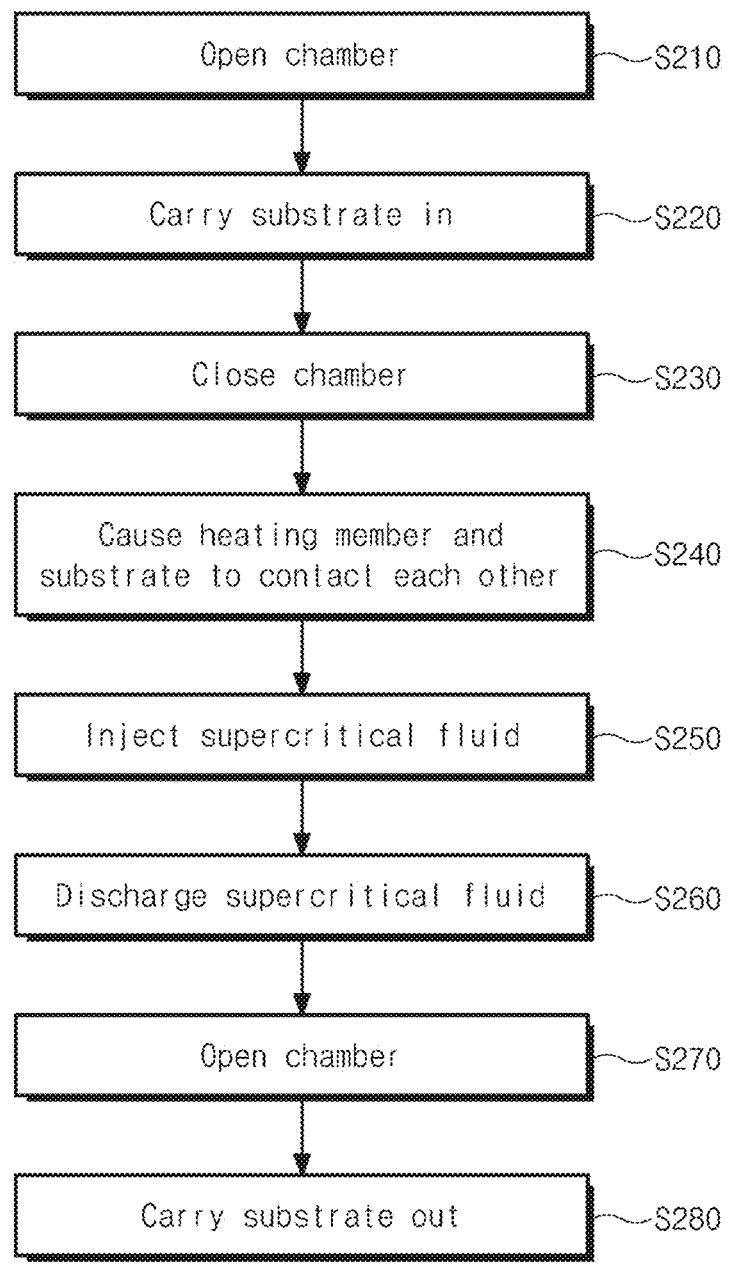
FIG. 16 is a flowchart illustrating a method of treating a substrate according to another embodiment by using the substrate treating apparatus according to the fourth embodiment of the inventive concept.

FIG. 16 is a flowchart illustrating a method of treating a substrate according to another embodiment by using the substrate treating apparatus according to the fourth embodiment of the inventive concept. Referring to FIG. 16, the process chambers 110 and 120 are opened (S210), and the substrate "W" is carried in (S220). After the substrate "W" is carried in, the process chambers 110 and 120 are closed (S230). Furthermore, the Leidenfrost effect is caused for the organic solvent "W" by causing the substrate heating member 140 and the substrate "W" in the process chambers 110 and 120 to contact each other (S240). The supercritical fluid starts to be injected into the process chambers 110 and 120 through the first support port 122 or the second support port 112 (S250). Furthermore, when the internal pressure of the process chambers 110 and 120 reaches the process pressure through the consistent injection of the supercritical fluid, the process of treating the substrate by using the supercritical fluid is performed. After the process, the supercritical fluid is exhausted (S260). When the supercritical fluid is exhausted and the internal pressure of the process chambers 110 and 120 becomes a normal pressure, the process chambers 110 and 120 are opened (S270) and the substrate "W" is carried out (S280).

According to various embodiment of the inventive concept, the substrate may be efficiently treated.

According to various embodiments of the inventive concept, a leaning phenomenon may be further improved when a substrate is dried.

According to various embodiments of the inventive concept, a temperature of a drying preventing liquid may be increased more promptly to decrease a period of time, for which a substrate reaches a supercritical phase, and a unit per equipment hour (UPEH) may be improved when the substrate is treated by a supercritical fluid, According to various embodiments of the inventive concept, a drying preventing liquid may be removed more effectively when a substrate having a pattern of a high aspect ratio.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. An apparatus for treating a substrate by using a supercritical fluid, the apparatus comprising:
    a process chamber configured to provide a treatment space, and including a chamber heater configured to increase a temperature of an interior of the treatment space;
    a substrate support provided in the treatment space and configured to support the substrate; and
    a substrate heating member configured to heat a lower surface of the substrate while contacting the lower surface of the substrate,
    wherein the process chamber is formed through combination of an upper chamber and a lower chamber coupled to the upper chamber according to upward/downward movement relative to the upper chamber and forming a sealed space through coupling with the upper chamber, and
    wherein the substrate support is coupled to the upper chamber, and the substrate heating member is coupled to the lower chamber, and
    wherein in a closed state wherein the upper chamber is coupled to the lower chamber, the substrate heating member is configured to interrupt the supercritical fluid from being directly ejected to the lower surface of the substrate.

2. The apparatus of claim 1, wherein a liquid film is formed on the substrate treated by using the supercritical fluid with a drying preventing liquid.

3. The apparatus of claim 2, wherein the substrate heating member is configured to heat the substrate to a temperature, at which the drying preventing liquid shows a Leidenfrost effect in a reaction with a surface of the substrate.

4. The apparatus of claim 2, wherein the substrate heating member is configured to heat the substrate to a transition boiling point of the drying preventing liquid or more.

5. The apparatus of claim 2, wherein the substrate heating member is configured to heat the substrate to 110° C. or more.

6. The apparatus of claim 1, wherein the chamber heater and the substrate heating member are controlled independently.

7. The apparatus of claim 1, wherein the substrate heating member has an area corresponding to a whole surface of the substrate.

8. The apparatus of claim 1, further comprising:
    a first supply port connected to a first supply line configured to supply a treatment liquid to a portion of the treatment space of the process chamber, which is located at a lower portion of the substrate,
    wherein the substrate heating member is disposed between the first supply port and the substrate support, and interrupts the supercritical fluid from the first supply port from being directly ejected to the substrate.

9. The apparatus of claim 8, wherein a substrate heater is embedded in an interior of the substrate heating member, and the substrate is heated with heat generated by the substrate heating member.

10. The apparatus of claim 8, wherein a substrate heater configured to heat the substrate heating member is provided in an interior of the lower chamber, and
    wherein the substrate heating member receives heat generated by the substrate heater and heats the substrate.

11. The apparatus of claim 8, wherein the lower chamber is formed of a stainless steel material.

12. The apparatus of claim 11, wherein the lower chamber and the substrate heating member are connected to each other by a material having a set thermal conductivity or more.

13. The apparatus of claim 1, wherein the substrate heating member is formed of a stainless steel material.

14. The apparatus of claim 1, wherein,
    the substrate support comprises a first vertical rod extending vertically from the upper chamber, and a first horizontal rod extending horizontally from one end of the first vertical rod, and wherein,
    in a closed state wherein the upper chamber is coupled to the lower chamber, the substrate is configured to sit on both an upper surface of the first horizontal rod and upper surface of the substrate heating member.

15. The apparatus of claim 14, wherein in an open state wherein the upper chamber is separate from the lower chamber, a rear surface of the substrate is separate from an upper surface of the substrate heating member.

16. The apparatus of claim 15, wherein in the closed statue the substrate heating member is configured to interrupt the supercritical fluid from being directly ejected to the rear surface of the substrate.

17. The apparatus of claim 1, further comprising:
a support rod connected to an upper portion of the lower chamber and a lower portion of the substrate heating member.

* * * * *